United States Patent

Ikarashi

(10) Patent No.: US 9,773,769 B2
(45) Date of Patent: Sep. 26, 2017

(54) SEMICONDUCTOR DEVICE

(71) Applicant: Toshiba Memory Corporation, Tokyo (JP)

(72) Inventor: Satoshi Ikarashi, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/055,278

(22) Filed: Feb. 26, 2016

(65) Prior Publication Data

US 2016/0268242 A1    Sep. 15, 2016

(30) Foreign Application Priority Data

Mar. 11, 2015 (JP) .................. 2015-048663

(51) Int. Cl.
*H01L 25/00* (2006.01)
*H01L 25/10* (2006.01)
*H01L 23/498* (2006.01)

(52) U.S. Cl.
CPC ........ *H01L 25/50* (2013.01); *H01L 23/49827* (2013.01); *H01L 25/105* (2013.01); *H01L 2225/107* (2013.01); *H01L 2225/1023* (2013.01); *H01L 2225/1058* (2013.01); *H01L 2924/14* (2013.01); *H01L 2924/1438* (2013.01); *H01L 2924/15311* (2013.01)

(58) Field of Classification Search
CPC ....... H01L 25/00; H01L 25/105; H01L 25/50; H01L 2225/107; H01L 2924/1438
See application file for complete search history.

(56) References Cited

U.S. PATENT DOCUMENTS

2001/0040464 A1\* 11/2001 Tanioka ............. G01R 1/07314
                                                     324/755.09
2010/0072598 A1\* 3/2010 Oh ........................ H01L 25/105
                                                     257/686

FOREIGN PATENT DOCUMENTS

| JP | 1999-135551 A | 5/1999 |
|---|---|---|
| JP | 2000-174066 A | 6/2000 |
| JP | 2001-144140 A | 5/2001 |
| TW | 200520114 | 6/2005 |
| TW | 201123365 | 7/2011 |
| TW | 201203495 | 1/2012 |

(Continued)

OTHER PUBLICATIONS

Taiwanese Office Action dated Nov. 16, 2016, filed in Taiwanese counterpart Patent Application No. 105107082, 8 pages (with English translation).

(Continued)

*Primary Examiner* — Phuc Dang
(74) *Attorney, Agent, or Firm* — Patterson & Sheridan, LLP

(57) ABSTRACT

A semiconductor device includes a substrate, a semiconductor package including a semiconductor chip, and a connector between the substrate and the semiconductor package, the connector having opposing first and second planar surfaces, the first planar surface in contact with the substrate and the second planar surface in contact with the semiconductor package. The connector also includes a plurality of wires extending between the first and second planar surfaces to electrically connect electrodes of the substrate to electrodes of the semiconductor package.

19 Claims, 6 Drawing Sheets

(56) References Cited

FOREIGN PATENT DOCUMENTS

| | | |
|---|---|---|
| TW | 201448151 | 12/2014 |
| TW | 201448292 | 12/2014 |

OTHER PUBLICATIONS

Taiwanese Office Action dated May 15, 2017, filed in Taiwanese counterpart Patent Application No. 105107082, 8 pages (with English translation).

* cited by examiner

SEMICONDUCTOR DEVICE

CROSS-REFERENCE TO RELATED APPLICATION

This application is based upon and claims the benefit of priority from Japanese Patent Application No. 2015-048663, filed Mar. 11, 2015, the entire contents of which are incorporated herein by reference.

FIELD

An embodiment described herein relates generally to a semiconductor device including an anisotropic conductive member.

BACKGROUND

Semiconductor devices which mount a semiconductor package using an anisotropic conductive member are known.

DETAILED DESCRIPTION

Figure 1:
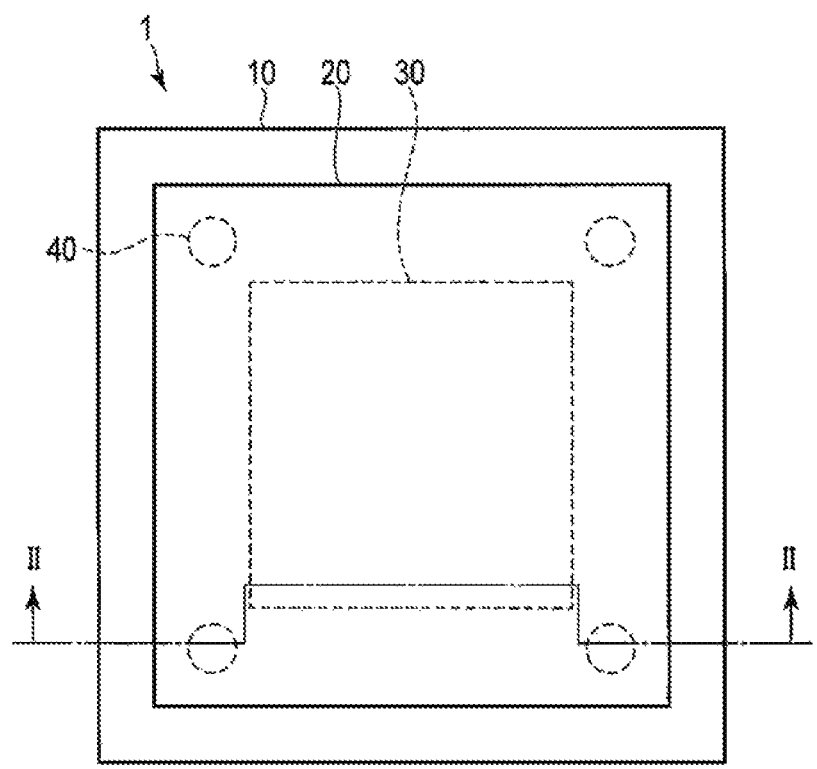
FIG. 1 is a plan view which shows a semiconductor device according to an embodiment.

Embodiments now will be described more fully hereinafter with reference to the accompanying drawings. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include plural forms as well, unless the context clearly indicates otherwise. It will be further understood that the terms "comprises," "comprising," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it may be directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it may be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, etc. may be used herein to describe various elements, components, regions, layers and/or sections, such elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", may therefore, encompasses both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" can, therefore, encompass both an orientation of above and below.

Embodiments are described herein with reference to cross section and perspective illustrations that are schematic illustrations of the embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

Embodiments provide a semiconductor device capable of improving mounting reliability of a semiconductor package.

According to an embodiment, a semiconductor device includes a substrate, a semiconductor package including a semiconductor chip, and a connector between the substrate and the semiconductor package, the connector having opposing first and second planar surfaces, the first planar surface in contact with the substrate and the second planar surface in contact with the semiconductor package. The connector also includes a plurality of wires extending between the first and second planar surfaces to electrically connect electrodes of the substrate to electrodes of the semiconductor package.

Hereinafter, Embodiments will be described with reference to drawings. In the following description, an element which has the same function and configuration will be denoted by the same reference numeral.

(Embodiment)

[1] Configuration of Semiconductor Device

Figure 2:
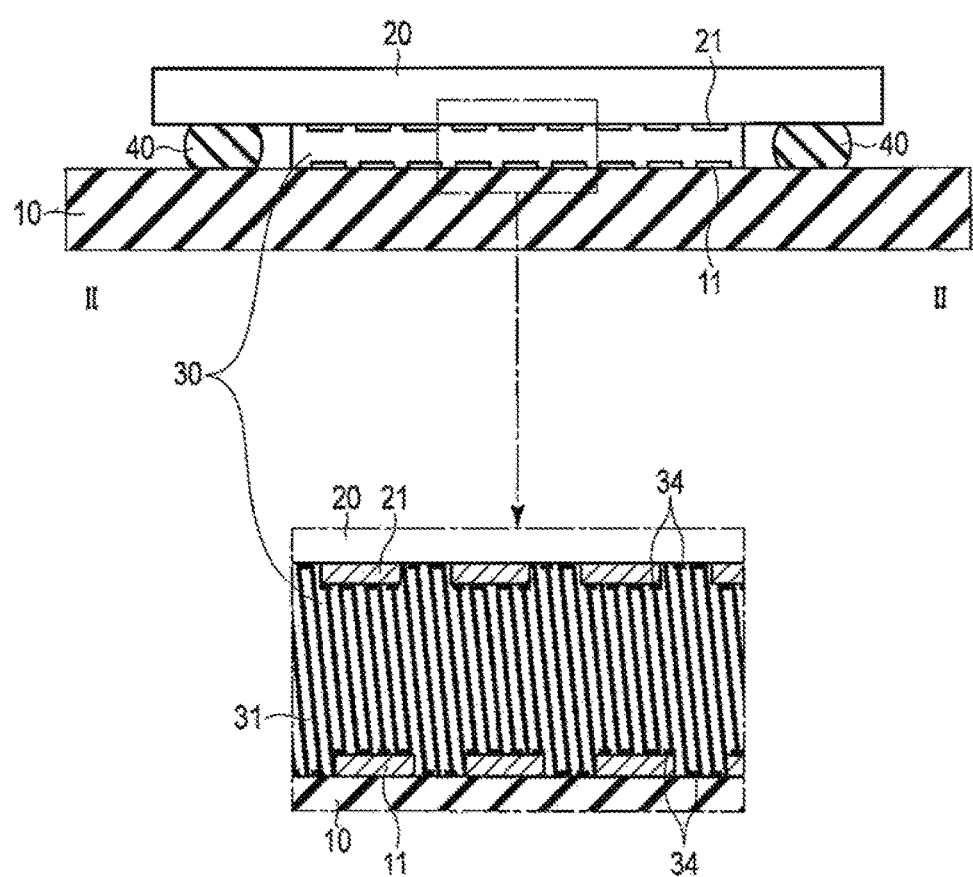
FIG. 2 is a sectional view of the semiconductor device taken along line II-II of FIG. 1.

With reference to FIGS. 1 and 2, a configuration of a semiconductor device according to an embodiment will be described.

As shown in the drawings, a semiconductor device 1 includes a substrate 10, a semiconductor package 20, an anisotropic conductive sheet 30, and a member 40.

The substrate 10 is a wiring board in which a circuit wiring is formed on an insulating substrate, and is, for example, a print wiring board. The substrate 10 has a first surface and a second surface, and a plurality of electrodes 11 are arranged on the first surface.

The semiconductor package 20 is made by enclosing a semiconductor chip in a package, and is, for example, a Ball Grid Array (BGA), a Chip Size Package (CSP), a Thin Small Outline Package (TSOP), and the like. An integrated circuit is formed in the semiconductor chip, as a result of which, for example, a NAND-type flash memory or a memory controller which controls the NAND-type flash memory is formed.

The semiconductor package 20 has a first surface and a second surface, and a plurality of electrodes 21 of the semiconductor chip are arranged on the first surface. The semiconductor package 20 has, for example, a rectangular shape.

The anisotropic conductive sheet 30 includes a plurality of metal wires 31 in an insulating sheet. The metal wires 31 extend in a thickness direction of the sheet and are arranged substantially in parallel with each other. The anisotropic conductive sheet 30 has a first surface and a second surface, and has conductivity in the thickness direction of the sheet and an insulating property in a direction parallel to its surface. Details of the anisotropic conductive sheet 30 will be described later.

The member 40 is made of, for example, a resin, a connector, and other members. Details of the member 40 will be described later.

The semiconductor device 1 has the following structure. The semiconductor package 20 is mounted onto the substrate 10. An electrode 21 of the semiconductor package 20 is opposed to an electrode 11 of the substrate 10. The anisotropic conductive sheet 30 is arranged between the substrate 10 and the semiconductor package 20.

The metal wires 31 in the anisotropic conductive sheet 30 are in contact with the electrode 11 of the substrate 10 and the electrode 21 of the semiconductor package 20, and electrically connect the electrode 11 and the electrode 21.

A number of suckers 34 are arranged on the first surface and the second surface of the anisotropic conductive sheet 30. The anisotropic conductive sheet 30 is sucked to the first surface and the electrodes 11 of the substrate 10, and the first surface and the electrodes 21 of the semiconductor package 20 by these suckers 34. Accordingly, the anisotropic conductive sheet 30 fixes the semiconductor package 20 to the substrate 10. The first surface and the second surface of the anisotropic conductive sheet 30 may be configured to have adhesive properties.

The electrode 21 of the semiconductor package 20 is electrically connected to the electrode 11 of the substrate 10 through the anisotropic conductive sheet 30.

The member 40 is provided respectively between four corners (package corner) of a rectangular shape of the semiconductor package 20 and the substrate 10. Accordingly, the member 40 also fixes the semiconductor package 20 to the substrate 10.

Hereinafter, each configuration will be described in an order of the anisotropic conductive sheet 30 and the member 40.

[1-1] Anisotropic Conductive Sheet 30

Figure 3:
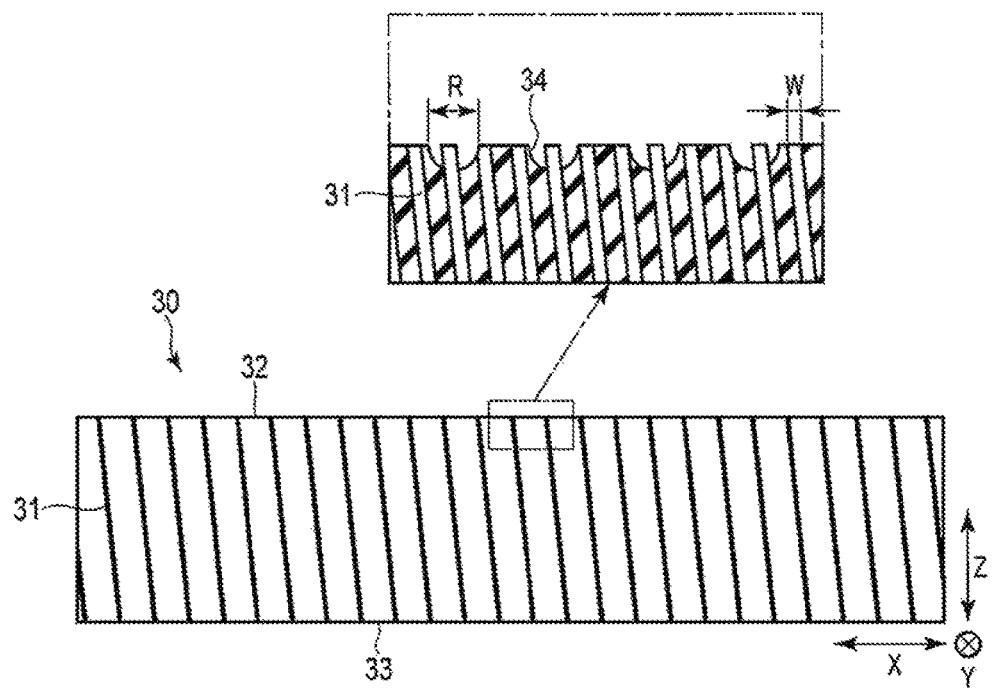
FIG. 3 is a sectional view of an anisotropic conductive sheet of the semiconductor device according to the embodiment.

With reference to sectional views of FIGS. 3 and 4, a configuration of the anisotropic conductive sheet 30 included in the semiconductor device 1 will be described.

The anisotropic conductive sheet 30 is formed from, for example, an insulating sheet (for example, silicon rubber). The plurality of metal wires 31 arranged in the sheet are arranged at equal intervals with high density in an X direction and a Y direction as shown in FIG. 3. One end and the other end of the metal wires 31 are exposed from a first surface 32 and a second surface 33 of the anisotropic conductive sheet 30, respectively.

An arrangement pitch of the metal wires 31 is, for example, 20 μm to 80 μm. A line width W of the metal wires 31 is, for example, 20 μm to 30 μm. For example, a gold-plated metal, iron, aluminum, gold, or the like is used for the metal wires 31.

The metal wires 31 are inclined with respect to the thickness direction (Z direction) of the anisotropic conductive sheet 30. Accordingly, it is possible to prevent any trouble that the metal wires 31 destroy an insulating material such as, when the anisotropic conductive sheet 30 is pressurized, the metal wires 31 moves so as to be inclined in one direction and the metal wires 31 are inclined or bent in an unfixed direction.

Figure 4:
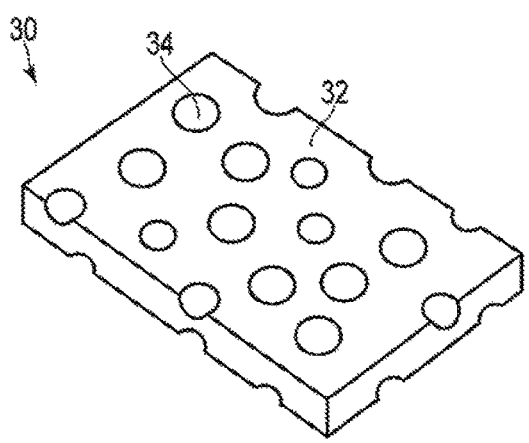
FIG. 4 is a perspective view of the anisotropic conductive sheet of the semiconductor device according to the embodiment.

A plurality of minute suckers 34 are arranged on the first surface 32 and the second surface 33 of the anisotropic conductive sheet 30, as shown in FIG. 4. The metal wires 31 are omitted in FIG. 4. About ten thousand of the suckers 34 are arranged in around, for example, 1 $cm^2$. A diameter R of the sucker 34 is about, for example, 50 μm to 60 μm. A size of the sucker 34 is less than a size of the electrode 11, 21. Furthermore, an arrangement pitch of the suckers 34 is larger than the arrangement pitch of the metal wires 31. In other words, the arrangement pitch of the metal wires 31 is smaller than the arrangement pitch of the suckers 34.

The sucker 34 of the anisotropic conductive sheet 30 has a function of being sucked onto each of the first surface and the electrode 11 of the substrate 10, and the first surface and the electrode 21 of the semiconductor package 20. Specifically, the anisotropic conductive sheet 30 is interposed between the substrate 10 and the semiconductor package 20, pressure is applied thereto to press the sucker 34 to the substrate 10 and the semiconductor package 20, and thereby air exits from the sucker 34. Accordingly, the inside of the sucker 34 becomes substantially a vacuum state, respectively, and through vacuum the anisotropic conductive sheet 30 is adhered to and in close contact with the substrate 10 and the semiconductor package 20.

It is described as an example that the sucker 34 is arranged on the first surface and the second surface of the anisotropic conductive sheet 30, but the sucker 34 may be arranged on only one of the first surface and the second surface of the anisotropic conductive sheet 30. In this case, a surface on which the sucker is not arranged may be configured to have adhesive properties.

[1-2] Member 40

With reference to FIGS. 1 and 2, a configuration of the member 40 included in the semiconductor device 1 will be described.

A resin (for example, epoxy resin, and the like) is used for the member 40. One member 40 is provided on, for example, each corner of the semiconductor package 20. However, the number of the members 40 is not limited to four, and any number, for example, two or six members may be provided.

Figure 5:
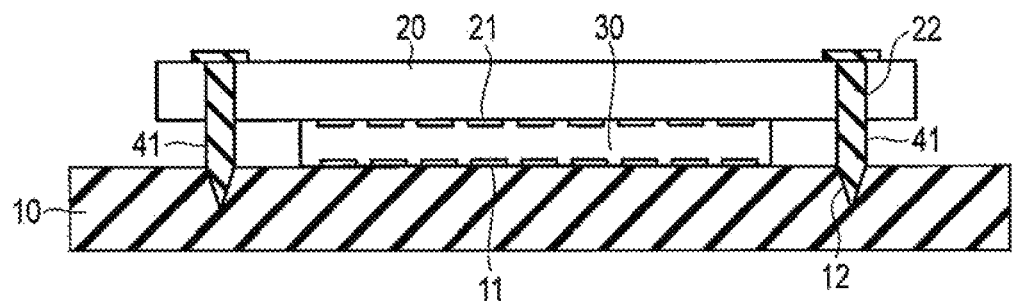
FIG. 5 is a sectional view which includes another member of the semiconductor device according to the embodiment.
Figure 6:
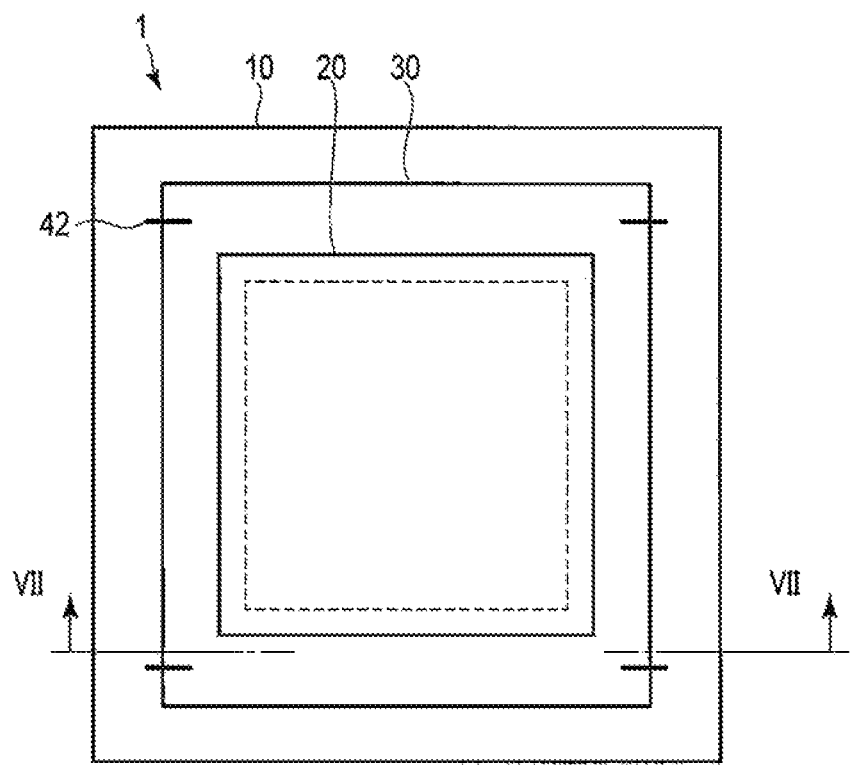
FIG. 6 is a plan view which includes still another member of the semiconductor device according to the embodiment.
Figure 7:
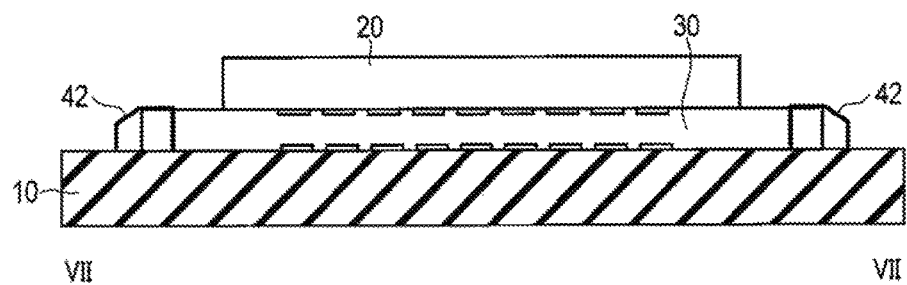
FIG. 7 is a sectional view of the semiconductor device taken along line VII-VII of FIG. 6.

With reference to FIGS. 5 to 7, other configurations of the member included in the semiconductor device 1 will be described.

As shown in FIG. 5, a pin-shaped connector 41 may be used as the member 40. When using the connector 41, a through-hole 22 is provided in the semiconductor package 20, and a connection portion 12 is provided in the substrate 10. The connector 41 is inserted into the through-hole 22 of the semiconductor package 20, and is connected to the connection portion 12 of the substrate 10 by threaded engagement, press fit, and other well-known connecting methods. Accordingly, the connector 41 fixes the semiconductor package 20 onto the substrate 10.

Moreover, a method of mechanically holding the anisotropic conductive sheet 30 on the member 40 is shown in FIGS. 6 and 7. In this method, wires, pins or staples 42, or the like may be used. When using the staples 42, the anisotropic conductive sheet 30 is formed to be larger than the semiconductor package 20 in a plan view. The staples 42 are attached to the four corners of the anisotropic conductive sheet 30 and the substrate 10. Accordingly, the staples 42 fix the anisotropic conductive sheet 30 onto the substrate 10.

[2] Other Configurations of the Semiconductor Device

Figure 8:
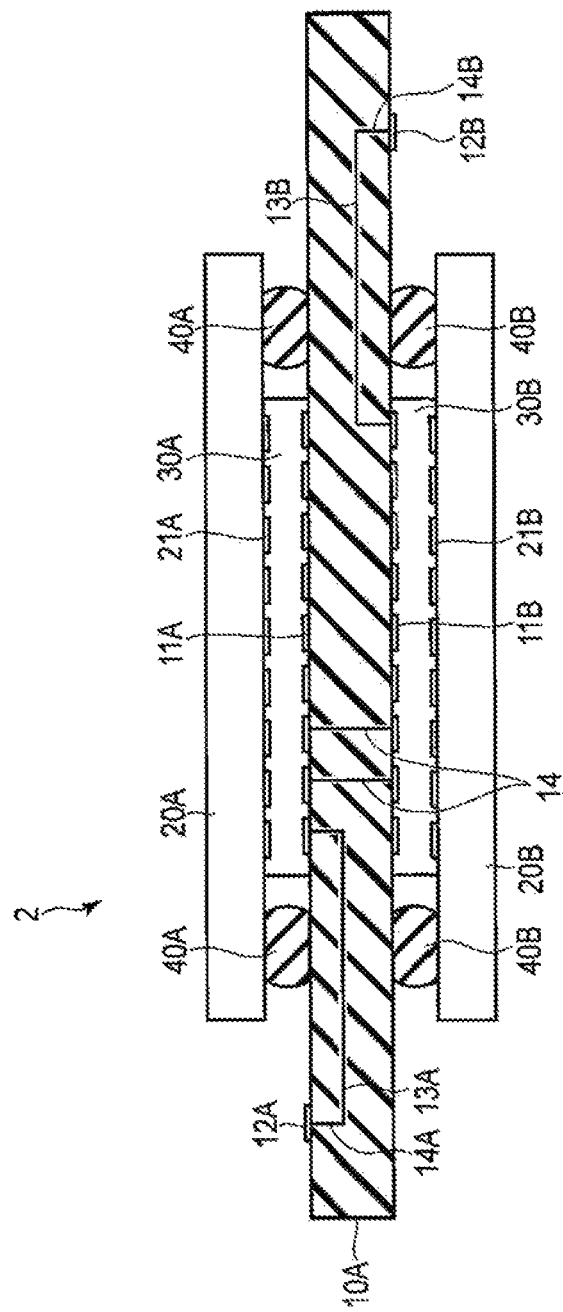
FIG. 8 is a sectional view which shows another configuration example of the semiconductor device according to the embodiment.

With reference to FIG. 8, other configuration examples of the semiconductor device according to the embodiment will be described. By using a substrate 10A which is capable of double-sided mounting, it is possible to mount semiconductor packages 20A and 20B onto both surfaces of the substrate 10A, respectively.

The semiconductor device 2 includes the substrate 10A, the two semiconductor packages 20A and 20B, two anisotropic conductive sheets 30A and 30B, and members 40A and 40B.

The substrate 10A is a wiring board on which circuit wiring is formed on the insulating substrate, and is, for example, a double-sided printed wiring board, or the like. When necessary, a multi-layer wiring board is used for the substrate 10A. The substrate 10A has a first surface and a second surface. A plurality of electrodes 11A and 12A are arranged on the first surface of the substrate 10A. A plurality of electrodes 11B and 12B are arranged on the second surface of the substrate 10B. Wirings 13A and 13B are arranged on a wiring layer in the substrate 10A. Furthermore, the through-hole 14 and the like which electrically connect the electrode 11A and the electrode 11B are formed in the substrate 10A.

The semiconductor package 20A has a first surface and a second surface, and a plurality of electrodes 21A of the packaged semiconductor chip are arranged on the first surface. The semiconductor package 20B has a first surface and a second surface, and a plurality of electrodes 21B of the packaged semiconductor chip are arranged on the first surface. For example, the semiconductor package 20A includes a NAND-type flash memory, and the semiconductor package 20B includes a memory controller that controls the NAND-type flash memory. The other configurations of the semiconductor packages 20A and 20B are the same as that of the semiconductor package 20 described above.

A configuration of the anisotropic conductive sheets 30A and 30B, and the members 40A and 40B is the same as a configuration of the anisotropic conductive sheet 30 and the member 40 described above, respectively.

The semiconductor device 2 has a structure as follows.

The semiconductor package 20A is mounted onto the first surface of the substrate 10A. The electrode 21A of the semiconductor package 20A is opposed to the electrode 11A of the substrate 10A. The anisotropic conductive sheet 30A is arranged between the substrate 10A and the semiconductor package 20A.

The semiconductor package 20B is mounted onto the second surface of the substrate 10A. The electrode 21B of the semiconductor package 20B is opposed to the electrode 11B of the substrate 10A. The anisotropic conductive sheet 30B is arranged between the substrate 10A and the semiconductor package 20B.

The suckers 34 are arranged on the first surface and the second surface of the anisotropic conductive sheet 30A. Using these suckers 34, the anisotropic conductive sheet 30A is sucked onto the first surface and the electrode 11A of the substrate 10A, and the first surface and the electrode 21A of the semiconductor package 20A, respectively. Accordingly, the anisotropic conductive sheet 30A fixes the semiconductor package 20A onto the substrate 10A.

In the same manner, the suckers are arranged on the first surface and the second surface of the anisotropic conductive sheet 30B. Using these suckers, the anisotropic conductive sheet 30B is sucked onto the second surface and the electrode 11B of the substrate 10A, and the first surface and the electrode 21B of the semiconductor package 20B, respectively. Accordingly, the anisotropic conductive sheet 30B fixes the semiconductor package 20B onto the substrate 10A. The first surfaces and the second surfaces of the anisotropic conductive sheets 30A and 30B may be configured to have adhesive properties.

The electrode 21A of the semiconductor package 20A is electrically connected to the electrode 11A of the substrate 10A through the anisotropic conductive sheet 30A. The electrode 21B of the semiconductor package 20B is connected to the electrode 11B of the substrate 10A through the anisotropic conductive sheet 30B.

The electrode 12A on the first surface of the substrate 10A is electrically connected to the electrode 11A through the wiring 13A and a through-hole 14A. The electrode 12B on the second surface of the substrate 10A is electrically connected to the electrode 11B through the wiring 13B and a through-hole 14B. The electrodes 12A and 12B are used in connection with, for example, an external circuit.

In addition, the through-hole 14 formed in the substrate 10A is electrically connected between the electrode 11A and the electrode 11B. Accordingly, an electrical connection between the electrode 21A of the semiconductor package 20A and the electrode 21B of the semiconductor package 20B may be achieved.

Moreover, the members 40A are provided between four corners of a rectangular shape of the semiconductor package 20A and the substrate 10A, respectively. Accordingly, the members 40A fix the semiconductor package 20A onto the substrate 10A.

In the same manner, the members 40B are provided between four corners of a rectangular shape of the semiconductor package 20B and the electrode 10A, respectively. Accordingly, the members 40B fix the semiconductor package 20B onto the substrate 10A.

[3] Effects of the Embodiment

With the semiconductor devices 1 and 2 according to the embodiment, it is possible to improve the mounting reliability of a semiconductor package onto a substrate.

A comparative example will be described so as to facilitate understanding of the effects.

For example, as an anisotropic conductive member which electrically connects a semiconductor package and a substrate, an anisotropic conductive film (ACF), an anisotropic conductive paste (ACP), an anisotropic conductive rubber, and the like are known.

However, the anisotropic conductive film and the anisotropic conductive paste have a concern of a leak that generated between the adjacent electrode and thereof, and detachment is difficult due to strong adhesion force (adhesive force). The anisotropic conductive rubber does not have adhesion force, and needs mechanical pressurization. In mounting by a general solder ball, heat stress is caused by soldering in a reflow, and detachment is difficult.

In contrast, the semiconductor devices 1 and 2 of the embodiment have a plurality of minute suckers provided in the first surface and the second surface of the anisotropic conductive sheet. The anisotropic conductive sheet is sucked onto the semiconductor package and the substrate using the suckers, and fixes the semiconductor package into the substrate. Therefore, since the anisotropic conductive sheet itself is in close contact with the semiconductor package and the substrate, there is no need to be pressurized from the outside.

Furthermore, metal wires are arranged in the anisotropic conductive sheet, and an end of the metal wires protrudes from a surface (the first surface and the second surface) of the sheet. The metal wires in the anisotropic conductive sheet are electrically connected between the electrode of the semiconductor package and the electrode of the substrate. Since the metal wires are arranged at equal intervals in an insulating sheet, it is possible to hold insulation between adjacent metal wires (between electrodes).

In addition, it is possible to increase connection strength and connection stability between the semiconductor package and the substrate by providing the member between the four corners of the semiconductor package and the substrate. Furthermore, the anisotropic conductive sheet has adhesion in the first surface and the second surface, such that it is possible to improve adhesion force between the semiconductor package and the substrate, and the anisotropic conductive sheet.

In addition, the members 40, 40A, and 40B, the connector 41, and the staples 42 have a function as a buffer material against pressure or impact from the outside. That is, when receiving pressure or impact from the outside, the members receive the power, whereby the power to be received by the anisotropic conductive sheet is relaxed. Moreover, since the anisotropic conductive sheet is in surface contact with the substrate and the semiconductor package, the anisotropic conductive sheet also functions as a buffer material against the pressure or the impact from the outside. That is, the anisotropic conductive sheet serves also as an underfill, such that the anisotropic conductive sheet becomes a buffer material of an external impact or thermal stress, and plays a role to improve the mounting reliability.

Since the anisotropic conductive sheet is sucked (or further adhesive when having adhesion) by a sucker, it is possible to repair the semiconductor device by removing the semiconductor package from the substrate without heating or the like.

With the above configuration, in the mounting of the semiconductor package onto the substrate, it is possible to improve mounting reliability which includes electrical connection between electrodes, and holding of connection strength between the substrate and the semiconductor package.

In the semiconductor device 2 according to the embodiment, it is possible to mount a plurality of semiconductor packages onto both surfaces (the first surface and the second surface) of the substrate using the anisotropic conductive sheet. Since the plurality of semiconductor packages can be mounted onto the both surfaces of the substrate, it is possible to reduce a mounting area.

Moreover, it is possible to reduce wiring resistance between the semiconductor packages compared to when mounting the plurality of semiconductor packages on one surface of the substrate. Furthermore, it is possible to reduce manufacturing process by mounting the plurality of semiconductor packages onto the both surfaces of the substrate at the same time.

In the semiconductor device 2, it is described as an example that one semiconductor package is mounted onto the first surface and the second surface of the substrate, respectively, but the invention is not limited thereto, and a plurality of semiconductor packages can be mounted onto the first surface or the second surface, respectively.

In addition, mounting by the anisotropic conductive sheet used in the embodiment can be replaced with mounting by solder.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a substrate;
   a semiconductor package including a semiconductor chip; and
   a first connector between the substrate and the semiconductor package, the first connector having opposing first and second planar surfaces, the first planar surface in contact with the substrate and the second planar surface in contact with the semiconductor package,
   the first connector also including a plurality of wires extending between the first and second planar surfaces to electrically connect electrodes of the substrate to electrodes of the semiconductor package, wherein the first connector has concavities along the first and second planar surfaces, the concavities along the first planar surface causing the substrate and the first connector to be adhered to each other by suction force and the concavities along the second planar surface causing the semiconductor package and the connector to be adhered to each other by suction force.

2. The semiconductor device according to claim 1, wherein the wires extend parallel with respect to one another along a direction that is inclined with respect to a thickness direction of the first connector.

3. The semiconductor device according to claim 2, wherein the wires are arranged at a first pitch, and the concavities are arranged at a second pitch larger than first pitch.

4. The semiconductor device according to claim 1, wherein
an area of the first planar surface of the first connector is smaller than a surface area of a planar surface of the substrate facing the first connector, and
an area of the second planar surface of the first connector is smaller than a surface area of a planar surface of the semiconductor package facing the first connector.

5. The semiconductor device according to claim 4, further comprising:
additional second connectors arranged between the substrate and the semiconductor package so that the first connector is between two of the additional second connectors.

6. The semiconductor device according to claim 5, wherein the additional second connectors are resin balls.

7. The semiconductor device according to claim 5, wherein the additional second connectors are pin-shaped connectors.

8. The semiconductor device according to claim 1, wherein:
an area of the first planar surface of the first connector is smaller than a surface area of a planar surface of the substrate facing the first connector, and
an area of a planar surface of the substrate is larger than a surface area of a planar surface of the semiconductor package facing the first connector.

9. The semiconductor device according to claim 8, further comprising:
staples or wires that hold first and second portions of the first connector against the substrate.

10. The semiconductor device according to claim 1, wherein the first connector is an anisotropic conductive sheet.

11. A semiconductor device comprising:
a substrate;
a semiconductor package including a semiconductor chip; and
a first connector between the substrate and the semiconductor package, the first connector having opposing first and second planar surfaces, the first planar surface in contact with the substrate and the second planar surface in contact with the semiconductor package,
the first connector also including a plurality of wires extending between the first and second planar surfaces to electrically connect electrodes of the substrate to electrodes of the semiconductor package;
additional second connectors arranged between the substrate and the semiconductor package so that the first connector is between two of the additional second connectors, wherein
an area of the first planar surface of the first connector is smaller than a surface area of a planar surface of the substrate facing the first connector, and
an area of the second planar surface of the first connector is smaller than a surface area of a planar surface of the semiconductor package facing the first connector.

12. The semiconductor device according to claim 11, wherein the first connector has concavities along the first and second planar surfaces, the concavities along the first planar surface causing the substrate and the first connector to be adhered to each other by suction force and the concavities along the second planar surface causing the semiconductor package and the connector to be adhered to each other by suction force.

13. The semiconductor device according to claim 12, wherein the wires extend parallel with respect to one another along a direction that is inclined with respect to a thickness direction of the first connector.

14. The semiconductor device according to claim 13, wherein the wires are arranged at a first pitch, and the concavities are arranged at a second pitch larger than first pitch.

15. The semiconductor device according to claim 11, wherein the additional second connectors are resin balls.

16. The semiconductor device according to claim 11, wherein the additional second connectors are pin-shaped connectors.

17. The semiconductor device according to claim 11, wherein:
an area of the second planar surface of the substrate is larger than the surface area of the planar surface of the semiconductor package facing the first connector.

18. The semiconductor device according to claim 17, further comprising:
staples or wires that hold first and second portions of the first connector against the substrate.

19. The semiconductor device according to claim 11, wherein the first connector is an anisotropic conductive sheet.

* * * * *